(12) United States Patent
Lee et al.

(10) Patent No.: US 9,172,022 B2
(45) Date of Patent: Oct. 27, 2015

(54) COMPOSITE STRUCTURE OF GRAPHENE AND POLYMER AND METHOD OF MANUFACTURING THE SAME

(71) Applicant: SAMSUNG ELECTRONICS CO., LTD., Suwon-si (KR)

(72) Inventors: Eun-kyung Lee, Seoul (KR); Byoung-lyong Choi, Seoul (KR); Seung-nam Cha, Seoul (KR); Jae-hyun Lee, Suwon-si (KR); Dong-mok Whang, Suwon-si (KR)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 0 days.

(21) Appl. No.: 13/689,055

(22) Filed: Nov. 29, 2012

(65) Prior Publication Data
US 2013/0139865 A1   Jun. 6, 2013

(30) Foreign Application Priority Data

Dec. 1, 2011   (KR) .......................... 10-2011-0127863

(51) Int. Cl.
| | |
|---|---|
| *H01L 35/28* | (2006.01) |
| *H01L 35/22* | (2006.01) |
| *H01L 35/32* | (2006.01) |
| *B32B 3/30* | (2006.01) |
| *B32B 3/26* | (2006.01) |
| *B82Y 30/00* | (2011.01) |

(52) U.S. Cl.
CPC ................ *H01L 35/28* (2013.01); *B32B 3/263* (2013.01); *B32B 3/30* (2013.01); *H01L 35/22* (2013.01); *H01L 35/32* (2013.01); *B82Y 30/00* (2013.01); *Y10T 428/24521* (2015.01); *Y10T 428/24612* (2015.01)

(58) Field of Classification Search
CPC ................................ H01L 35/28; B32B 3/263
USPC ................... 136/205; 977/734, 753; 264/105; 428/161, 272
See application file for complete search history.

(56) References Cited

U.S. PATENT DOCUMENTS

| | | | |
|---|---|---|---|
| 6,822,780 B1 * | 11/2004 | Long, Jr. ..................... | 359/291 |
| 2010/0171393 A1 * | 7/2010 | Pei et al. ..................... | 310/330 |
| 2011/0030991 A1 * | 2/2011 | Veerasamy ................. | 174/126.1 |
| 2011/0048625 A1 | 3/2011 | Caldwell et al. | |

FOREIGN PATENT DOCUMENTS

| | | |
|---|---|---|
| JP | 2006150807 A | 6/2006 |
| KR | 1020110020442 A | 3/2011 |
| KR | 1020110047454 A | 5/2011 |
| KR | 10-2012-0029864 A | 3/2012 |
| WO | WO 2012145605 A1 * | 10/2012 |

OTHER PUBLICATIONS

Choongho Yu et al; "Thermoelectric Behavior of Segregated-Network Polymer Nanocomposites"; Nano Letters 2008, vol. 8, No. 12, pp. 4428-4432.

* cited by examiner

*Primary Examiner* — Jeffrey T Barton
*Assistant Examiner* — Tae-Sik Kang
(74) *Attorney, Agent, or Firm* — Sughrue Mion, PLLC (57) ABSTRACT

A composite structure of graphene and polymer and a method of manufacturing the complex. The composite structure of graphene and polymer includes: at least one polymer structure having a three-dimensional shape; and a graphene layer formed on the at least one polymer structure.

16 Claims, 7 Drawing Sheets

COMPOSITE STRUCTURE OF GRAPHENE AND POLYMER AND METHOD OF MANUFACTURING THE SAME

CROSS-REFERENCE TO RELATED APPLICATIONS

This application claims the benefit of Korean Patent Application No. 10-2011-0127863, filed on Dec. 1, 2011, in the Korean Intellectual Property Office, the disclosure of which is incorporated herein in its entirety by reference.

BACKGROUND

1. Field

The present disclosure relates to a composite structure of graphene and a polymer, and more particularly, to a composite structure of a three-dimensional polymer structure and a graphene layer disposed on a surface of the three-dimensional polymer structure, and methods of manufacturing the complexes.

2. Description of the Related Art

Carbonaceous materials exist in various forms such as graphite, buckyball, carbon nanotube (also known as "CNT"), and graphene. A buckyball, which has a ball structure and is formed of sixty carbon atoms, is a carbon allotrope also called fullerene. A molecular structure of a buckyball includes fifteen pentagons and twenty hexagons. The pentagons are each surrounded by the hexagons. Carbon nanotube has a tubular structure and includes carbon atoms bonded to one another in hexagonal honeycomb patterns, and has a dimension as small as single digit nanometer in case of a single wall nanotube. Grephene, which is another allotrope of carbon, has a structure of one-atom-thick planar sheets of $sp^2$-bonded carbon atoms that are densely packed in a honeycomb crystal lattice. The crystalline or "flake" form of graphite consists of many graphene sheets stacked together. The carbon-carbon bond length in graphene is about 0.142 nm. Graphene is the basic structural element of some carbon allotropes including graphite, charcoal, carbon nanotubes and fullerenes. Due to its unique structure of two dimension, graphene differs from most conventional three-dimensional materials: it has high electron mobility at room temperature, high opacity for an atomic monolayer, excellent thermal characteristics, chemical stability, a large surface area, and reportedly the greatest mechanical strength (breaking strength and tensile modulus).

Recently, extensive and vigorous research to apply graphene to various fields such as nanoelectronics, optoelectronics, and chemical sensors is under progress. Graphene may be synthesized by using chemical vapor deposition (CVD) using a transition metal such as nickel or copper as a catalyst. In addition, graphene may be obtained by tearing off graphite sheet by sheet. Graphene is usually used in sheet form but may also be prepared in tubular form (which is also referred to as "carbon nanotube.").

SUMMARY

Provided are a composite structure of a graphene layer and a three-dimensional polymer structure in which the graphene layer is disposed on a surface of the three-dimensional polymer structure, and methods of manufacturing the composite structure.

Additional aspects will be set forth in part in the description which follows and, in part, will be apparent from the description, or may be learned by practice of the presented embodiments.

According to an aspect of the present invention, a composite structure of graphene and polymer includes: at least one polymer structure having a three-dimensional shape; and a graphene layer formed on the at least one polymer structure.

The at least one polymer structure may have an uneven surface, and the graphene layer may be formed on the uneven surface. The graphene layer may have a single-layer structure or a multi-layer structure.

At least one of the polymer structure and the graphene layer may be doped with impurities.

A plurality of polymer structures may be stacked vertically on one another. The graphene layers on the polymer structures may be at least partially contacted to one another.

Each of the polymer structures may include an elongated protrusion. When plural polymer structures are stacked and the longitudinal axis of the elongated protrusion is defined by the length of the protrusion, the elongated protrusion of one layer of the polymer structure may be arranged so that its longitudinal axis is in an orientation different from the longitudinal axis of an elongated protrusion of a neighboring layer of the polymer structure. In an embodiment, a composite structure of graphene and polymer is provided, which composite structure containing at least one polymer structure of a three-dimensional shape; and a graphene layer covering a part of the polymer structure, wherein the composite structure has a first height determined from a baseline and has a second height determined from the baseline, said first height being the same as or greater than the thickness of the graphene layer, and said second height being greater than the first height. The composite structure of graphene and polymer may have a plurality of sub-structures each having the first height and the second height.

According to another embodiment, there is provide a thermoelectric element including: a composite structure and a first and a second conducting wires, wherein the composite structure contains: at least one polymer structure that is three-dimensional; and a graphene layer provided on the polymer structure; wherein the composite structure has a first height determined from a baseline and has a second height determined from the baseline, said first height being the same as or greater than the thickness of the graphene layer, and said second height being greater than the first height; wherein the first conducting wire is connected to a part of the graphene layer of the composite structure having the first height; and wherein the second conducting wire is connected to a part of the graphene layer of the composite structure having the second height.

According to another aspect of the present invention, a method of manufacturing a composite structure of graphene and polymer, includes: providing a growth substrate having a volumetric surface; synthesizing a graphene layer on a surface of the growth substrate; forming a polymer structure on the graphene layer; and removing the growth substrate.

The polymer structure may have a three-dimensional shape and a protrusions on a surface, and the graphene layer may be formed on the surface having the protrusions.

The growth substrate may include a substrate having the volumetric surface and a growth film formed on the surface of the substrate.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. Expressions such as "at least one of," when preceding a list of elements, modify the entire list of elements and do not modify the individual elements of the list. In the drawings, the thicknesses of layers and regions are exaggerated for clarity.

The term "composite structure" as used in the application is intended to indicate a structure which is formed from two or more constituent materials with significantly different physical or chemical properties which remain separate and distinct at the macroscopic or microscopic scale with the finished structure. Therefore, the term "composite structure of graphene and a polymer," as used in the application is intended to mean a structure which is formed from graphene and a polymer, and graphene and polymer remain distinct at the microscopic or nanoscopic scale within the finished structure.

The "composite structure" may optionally further have a substrate on which the above explained composite structure of graphene and a polymer is disposed. Alternatively, In the drawings, composite structure is depicted as containing a substrate.

Figure 1:
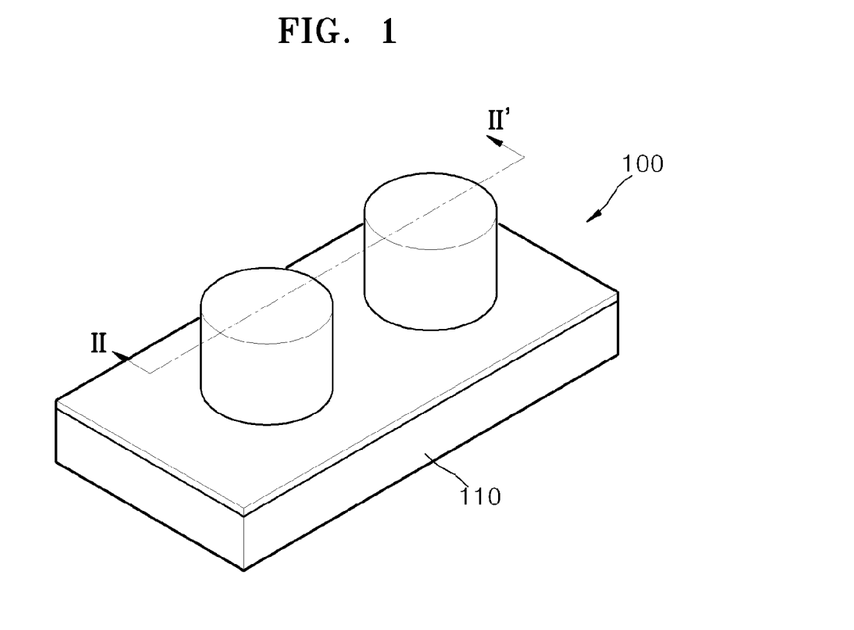
FIG. 1 is a perspective view illustrating a composite structure of graphene and polymer according to an exemplary embodiment of the present invention.
Figure 2:
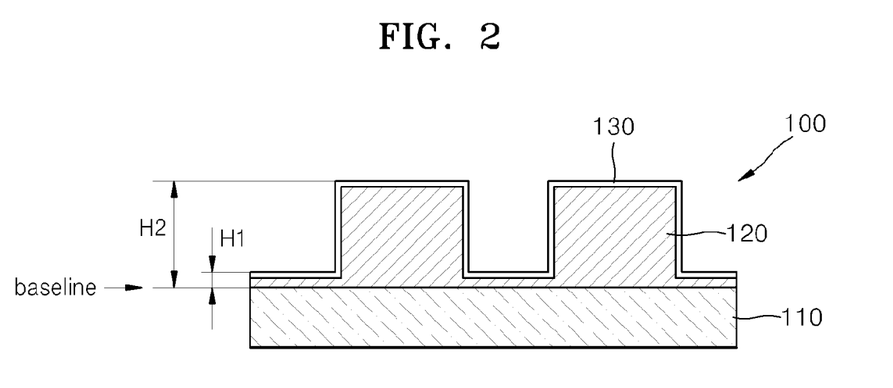
FIG. 2 is a cross-sectional view of the composite structure of graphene and polymer of FIG. 1 cut along a line II-II', wherein "H1" and "H2" indicates the first height and second height of the composite structure 100.

FIG. 1 is a perspective view illustrating a structure 100 containing a composite structure of graphene and polymer according to an exemplary embodiment of the present invention. FIG. 2 is a cross-sectional view of the structure 100 of graphene and polymer of FIG. 1 cut along a line II-II'.

Referring to FIGS. 1 and 2, the structure 100 contains a composite structure of a graphene layer and a polymer, and a substrate 110. The structure 100 includes a polymer structure 120 and a graphene layer 130 on a surface of the polymer structure 120. The polymer structure 120 is of a three-dimensional structure. It may have a first surface, a second surface which is opposite to the first surface, and a third surface connecting the first and the second surface. The polymer structure 120 may have a various three-dimensional configuration on one or more of the surfaces to have an uneven thickness. In an embodiment, the polymer structure may have a protrusion on its surface(s). For example, the polymer structure 120 illustrated in FIG. 1 has cylindrical protrusions having a height. The protrusions may also be rectangular or cone-shaped other than the cylindrical shape, and the height of the protrusions may also vary. Also, the polymer structure 120 may include a recess portion such as a groove.

The graphene layer 130 is disposed on a surface of the polymer structure 120. In an embodiment, the graphene layer 130 is disposed on the surface of the polymer structure 120, where a protrusion or a groove is provided to provide different thickness of the polymer structure. The graphene layer 130 may further be provided on other surfaces of the polymer structure. In an embodiment, the graphene layer 130 may be continuous. The graphene layer 130 may cover the entity of the uneven surface of the polymer structure 120, the surface being provided with a protrusion or a groove. The graphene layer 130 may be formed of graphene having a single-layer structure or a multi-layer structure. Thus, by forming the graphene layer 130 having a thickness of a single or multiple layers of graphene on the polymer structure 120 which is three-dimensional, the composite structure 100 of graphenes and polymer may be formed into a three-dimensional structure. The composite 100 of graphenes and polymer may have various three-dimensional shapes by varying the shape of the polymer structure 120 as described above. Referring to FIGS. 1 and 2, for example, the polymer structure 120 has protrusions on a surface and the graphene layer 130 is disposed to cover the surface of the polymer structure 120 where the protrusions are provided, and the polymer structure 120 is disposed on a surface of a substrate 110. According to this embodiment, the graphene layer 130 is not direct contact with the substrate 110. Thus, the resulting composite structure 100 has a first height H1 which is corresponds to the sum of the thickness of the graphene layer 130 and the thin part of the polymer structure 120 and a second height H2 which is the sum of the thickness of the graphene layer 130 and the thick part of the polymer structure 120. As will be described hereinafter, plural three-dimensional polymer structures may be disposed on a surface of a substrate with a space between each of the polymer structures and a graphene layer may be disposed to cover the polymer structures and the surface of the substrate where the polymer structures are not disposed. In this case, the graphene layer may be in direct contact with the portion(s) of the surface of the substrate. In this case, as shown in FIG. 3, the resulting composite structure 100' has a first height H1 which is corresponds to the thickness of the graphene layer 130' and a second height H2 which is the sume of the thickness of the graphene layer 130' and the thickness the polymer structure 120'.

Figure 3:
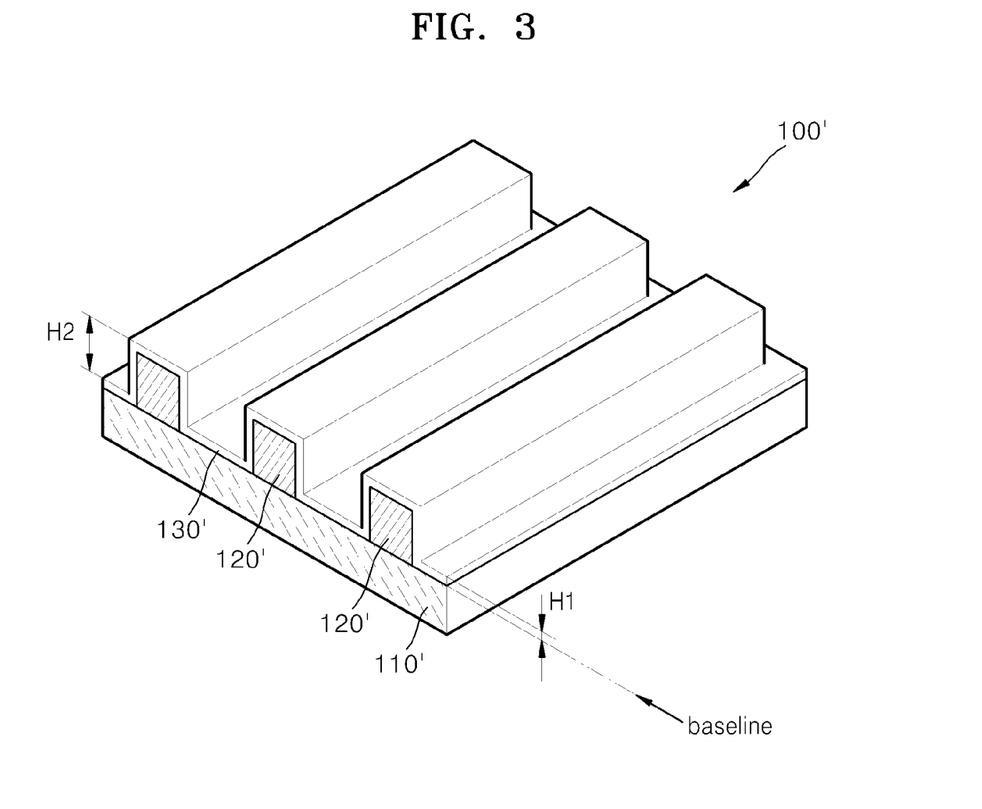
FIG. 3 is a schematic view of a composite structure of graphene and polymer according to an exemplary embodiment of the present invention, wherein "H1" and "H2" indicates the first height and second height of the composite structure 100'. In this embodiment, the first height H1 corresponds to the thickness of the graphene layer 130'.

FIG. 3 is a schematic view of a composite 100' of graphene and polymer according to an exemplary embodiment of the present invention. Referring to FIG. 3, the composite structure 100' contains a substrate 110' on which polymer structures 120' of a three-dimensional shape are disposed with a space between each of the polymer structure. While the embodiment depicted in FIG. 3 employs a polymer structure of an elongated rectangular shape, the polymer structures may have a various shape as long as it of a three dimension. In this exemplary embodiment, the polymer structures 120' are arranged parallel with a space between each of the polymer structures. However, a single polymer structure 120' may be disposed. The graphene layer 130' is disposed to cover the polymer structures. The graphene layer may be continuous and, thus, the graphene layer 130' is in direct contact with the part of the surface of the substrate where the polymer structures are disposed. Therefore, according to this embodiment, the substrate will be in direct contact in part with the polymer structures 120' and in direct contact in part with the graphene layer 130'.

Figure 4:
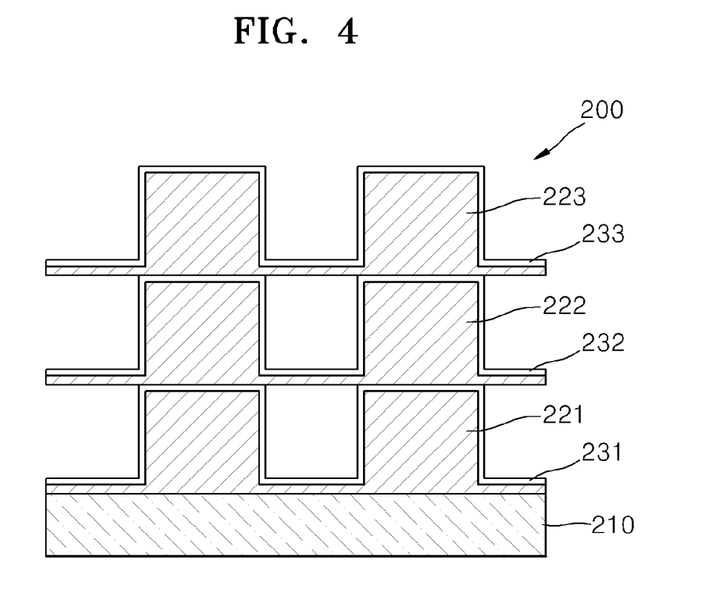
FIG. 4 is a schematic view of a composite structure of graphene and polymer according to an exemplary embodiment of the present invention.

FIG. 4 is a schematic view of a composite structure of 200 graphene and polymer according to an exemplary embodiment of the present invention.

Referring to FIG. 4, the composite structure 200 has multiple layers of the structure of a three-dimensional polymer structure and a graphene layer covering a part of the polymer. In detail, a plurality of polymer structures 221, 222, and 223 that are three-dimensional are stacked on the substrate 210, and graphene layers 231, 232, and 233 are respectively formed on surfaces of the polymer structures 221, 222, and 223. The polymer structures 221, 222, and 223 may have various three-dimensional shapes. For example, the structures 221, 222, and 223 may include protrusions having various shapes such as a cylindrical shape or may be elongated along an planar axis of a surface of the substrate. Alternatively, the structures may have grooves or trenches or sunken structure so that the polymer structure may have an uneven thickness (not shown in Figures). The graphene layers 231, 232, and 233 formed to cover the surface of the individual polymer structures 221, 222, and 223 where the protrusions or grooves are formed. The graphene layers 231, 232, 233 may be formed of graphene having a single-layer structure or a multi-layer structure. One or more of the graphene layers 231, 232, and 233 may be of a single layer graphene while the remaining are of a multi-layer. Or, all of the graphene layers 231, 232 and 233 may be of a single-layer or multi-layer graphene. In FIG. 4, the protrusions of the polymer structures 221, 222, and 223 are vertically aligned in FIG. 4, but the present invention is not limited thereto. The protrusions or grooves may be formed irregularly or regularly. And, the protrusions of one polymer structure may not be aligned with the protrusions of the other polymer structures.

Figure 5:
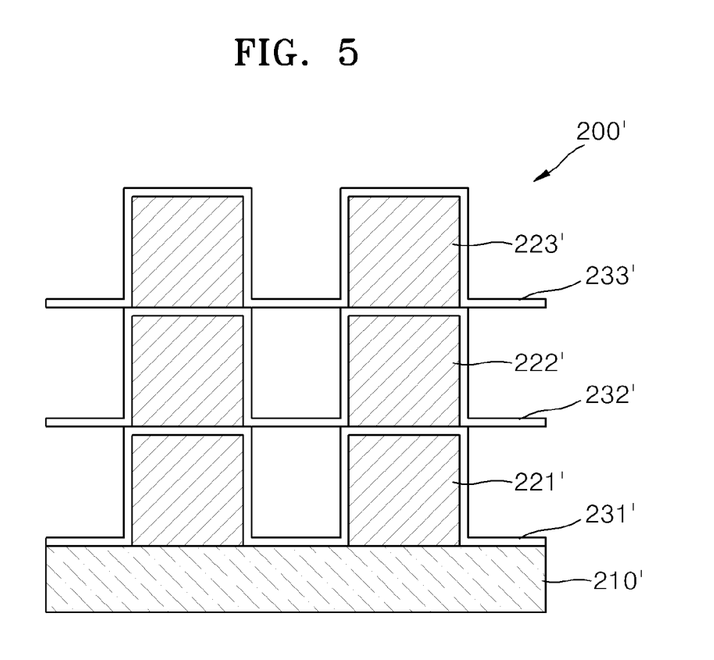
FIG. 5 is a schematic view of a composite structure of graphene and polymer according to an exemplary embodiment of the present invention.

FIG. 5 is a schematic view of a composite structure 200' according to an exemplary embodiment of the present invention.

Referring to FIG. 5, the composite structure 200' contains multiple layers of structures of graphene and polymer (223'-233', 222'-232', and 221'-231') and a substrate 210'. The composite structure 200' includes a plurality of polymer structures 221', 222', and 223' that are stacked vertically and graphene layers 231', 232', and 233' that are formed on the polymer structures 221', 222', and 223'. The polymer structures 221', 222', and 223' may have various three-dimensional shapes, and the graphene layers 231', 232', and 233' may be formed of graphene of a single-layer structure or a multi-layer structure. According to the current embodiment of the present invention, the graphene layer 231' covers at least one surface of the polymer structures 221', each member of polymer structures 221' is separated from the other, and connects the discrete polymer structures 221'. In other embodiment, there may be a single polymer structure 221'. The graphene layer 231' is in direct contact with the graphene layer 232' of the neighboring structure of polymer 222' and graphene layer 232' to form a continuous electrical path along the stack. Thus, if electrical characteristics of the polymer structures 221', 222', and 223' are poor, electricity may flow through the graphene layers 231', 232', and 233' that are contacted to one another. Meanwhile, FIG. 5 depicts a structure where polymer structures 221', 222', and 223' are vertically aligned, the present invention is not limited thereto and the polymer structures may not be aligned.

Figure 6:
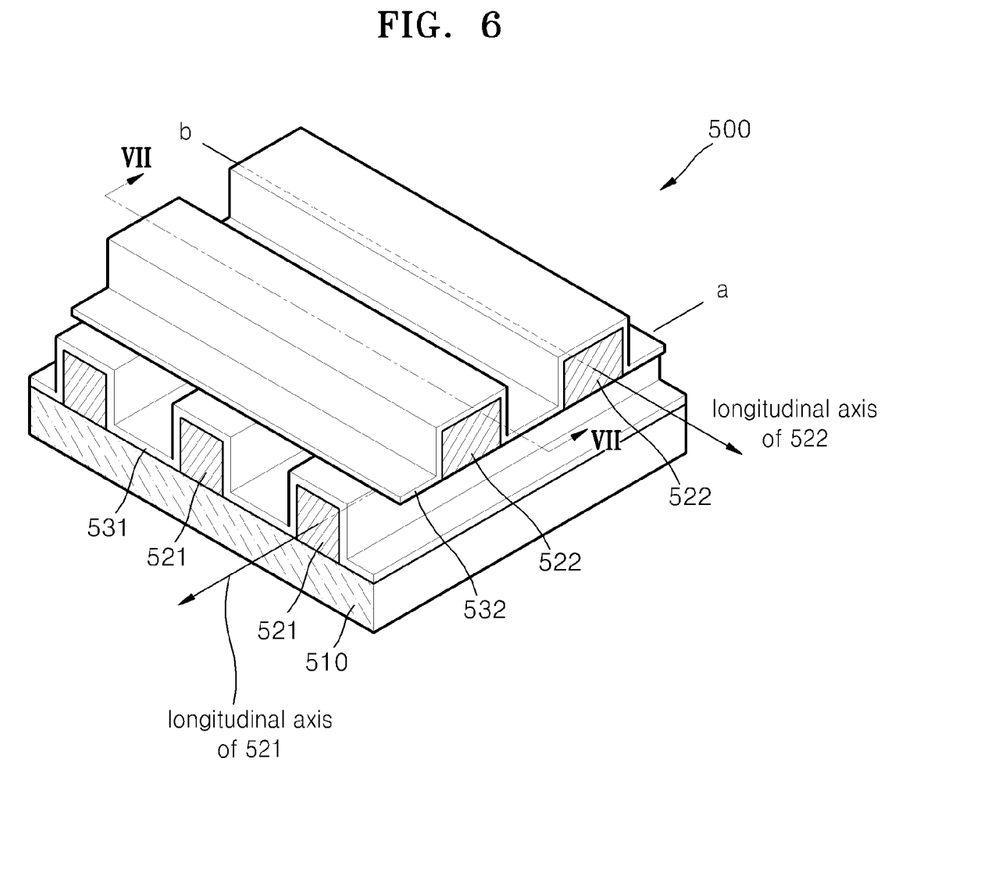
FIG. 6 is a schematic view of a composite structure of graphene and polymer according to an exemplary embodiment of the present invention.
Figure 7:
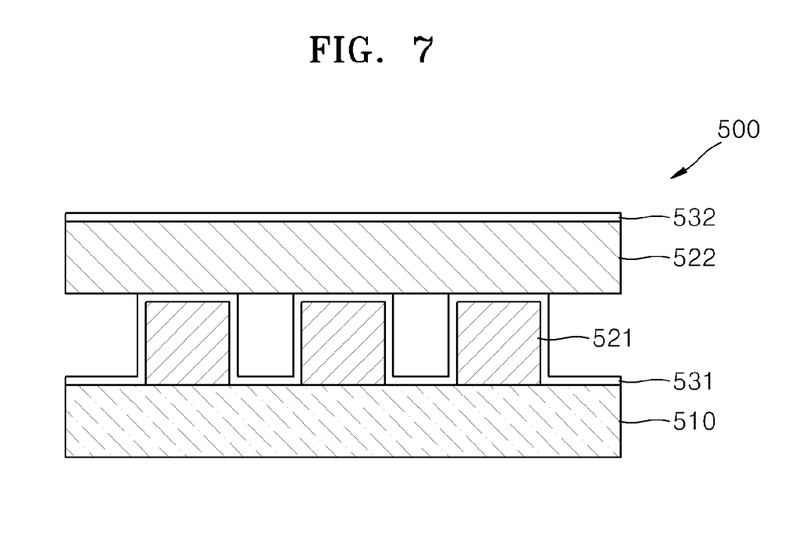
FIG. 7 is a cross-sectional view of the composite structure of graphene and polymer of FIG. 6 cut along a line VII-VII'.

FIG. 6 is a schematic view of a composite 500 of graphene and polymer according to an exemplary embodiment of the present invention. FIG. 7 is a cross-sectional view of the composite 500 of graphene and polymer of FIG. 6 cut along a line VII-VII'.

Referring to FIGS. 6 and 7, the composite 500 of graphene and polymer formed on a substrate 510 includes a plurality of polymer structures 521 and 522 that are vertically stacked on each other and graphene layers 531 and 532 formed on the respective individual polymer structures 521 and 522. The polymer structures 521 and 522 may have an elongated form. In other embodiments, the polymer structures 521 and 522 may be a continuous structure having protrusions or grooves, wherein the protrusions or grooves may be elongated along one axis of a surface of the polymer structure, as described above with regard to FIG. 4. For example, the polymer structures 521 and 522 may be of plural elongated structures arranged to be parallel to each other with a distance therebetween. In other embodiment, the polymer structures 521 and 522 may be of a single elongated three-dimensional structure. The graphene layers 531 and 532 may each be formed of graphene of a single-layer or multi-layer structure. According to the current embodiment of the present invention, the elongated polymer structure(s) of each layer of the stacked structure may have an orientation same as or different from the orientation(s) of the elongated polymer structures of the other layers of the stacked structure. That is, when a longitudinal axis of the elongated polymer structures is defined by the length direction of the elongated polymer structures, the longitudinal axis of elongated polymer structure of one layer may be same as or different from the longitudinal axis of other layers of the stacked structure. FIGS. 6 and 7 show an embodiment where the longitudinal axes are cross each other between layers. While the graphene layers 531 and 532 on the polymer structures 521 and 522 are illustrated as being in direct contact with each other in FIGS. 6 and 7, and the graphene layers 521 and 522 may be not in contact with each other.

Generally, the higher the thermoelectric figures of merit of a thermoelectric element, the better characteristics have the thermoelectric element. The thermoelectric figures of merit are proportional to electric conductivity and are inversely proportional to thermal conductivity. Thus, in order to improve characteristics of thermoelectric elements, high electric conductivity and low thermal conductivity are necessary. Polymer has a low thermal conductivity in a range from about 0.1 to about 0.5 W/mk, but has poor electric conductivity, and thus it is difficult to apply only polymer to a thermoelectric element. Likewise, graphene has both good thermal conductivity and good electric conductivity, and thus it is difficult to use only graphene to form a thermal element. However, the composite structures 100 and 200 according to the exemplary embodiments of the present invention have both excellent electric conductivity of graphene and low thermal conductivity of polymer, and thus may be used effectively in thermoelectric elements. In addition, when using the composite structures 100 and 200 to thermal elements or the like, at least one of the polymer structures 120, 221, 222, and 223 and graphene layers 130, 231, 232, and 233 may be doped with impurities. The composite structures 100 and 200 may also be applied in various fields such as capacitors, sensors, or optical elements.

Figure 8:
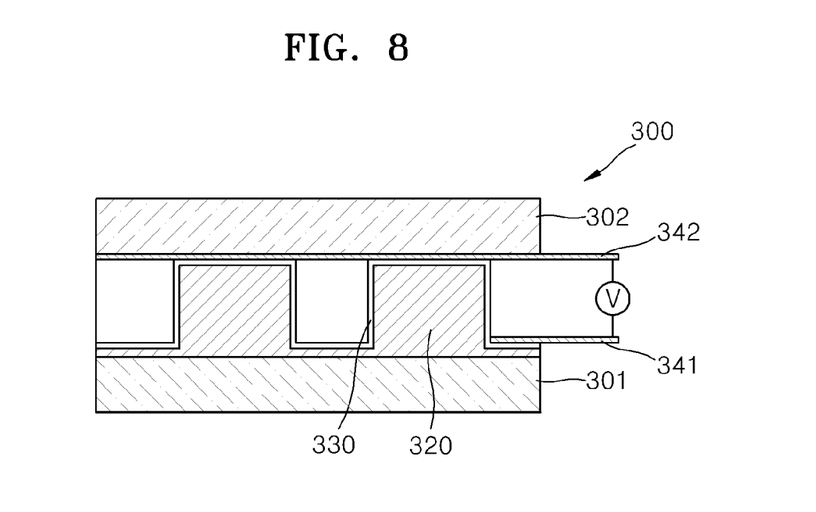
FIG. 8 is a schematic view of a thermoelectric element according to an exemplary embodiment of the present invention.

FIG. 8 is a schematic view of a thermoelectric element 300 according to an exemplary embodiment of the present invention.

Referring to FIG. 8, a graphene layer 330 is formed on a polymer structure 320 of a three-dimensional. The polymer structure 320 may have various three-dimensional forms and include an uneven surface that may have protrusions or grooves. The graphene layer 330 may be formed on the uneven surface of the polymer structure 320. The graphene layer 330 may be continuous and may cover the entity of the uneven surface of the polymer structure 320. The graphene layer 330 may be formed of graphene of a single-layer structure or a multi-layer structure. If desired, at least one of the polymer structure 320 and the graphene layer 330 may be doped with impurities. For example, the polymer structure 320 and the graphene layer 330 may be respectively doped with p-type and n-type impurities or n-type and p-type impurities. Also, one of the polymer structure 320 and the graphene layer 330 may be doped with p-type or n-type impurities.

A first conductive wire 341 and a second conductive wire 342 may be connected to a first portion and a second portion of the graphene layer 330, respectively. For example, the first conductive wire 341 may be connected to a portion or region of the graphene layer 330 where the graphene layer 330 covers the surface of the polymer structure 320 (this portion of the polymer structure 320 has a smaller height than its protrusion(s)), and the second conductive wire 342 may be connected to a portion or region of the graphene layer 330 where the graphene layer 330 covers the protrusion of the polymer structure 320 (the protrusion has a greater height than the surface of the polymer structure 320). In other embodiment (not shown in Figures) where the polymer structure has a groove(s), the first conductive wire 341 may be connected to a portion or region of the graphene layer 330 where the graphene layer 330 covers the groove (the groove of the polymer structure 320 has a smaller height than the surface of the polymer structure 320), and the second conductive wire 342 may be connected to a portion or region of the graphene layer 330 where the graphene layer 330 covers the surface of the polymer structure 320 (the surface has a greater height than the groove provided in the surface of the polymer structure 320).

The first and second conductive wires 341 and 342 may be formed of a material having a good electric conductivity such as gold (Au). In addition, a first heat source 301 may be disposed to be adjacent to the lower portion of the polymer structure 320, and a second heat source 302 may be disposed to be adjacent to the upper portion of the polymer structure 320.

In the above-described structure, if the first and second heat sources 301 and 302 are heat sources of different temperatures, thermoelectric effects are generated due to the low thermal conductivity of polymer and the excellent electric conductivity of graphene. Accordingly, a current may flow through the graphene layer 330 formed on the polymer structure 320 in a direction from the first heat source 301 to the second heat source 302 or from the second heat source 302 to the first heat source 301. Accordingly, electricity may be generated in a load that is connected between the first and second conductive wires 341 and 342. The thermoelectric element 300 according to the current embodiment of the present invention may employ various types of composite structures containing graphene and polymers described with reference to the embodiments of the present invention above.

Figure 9:
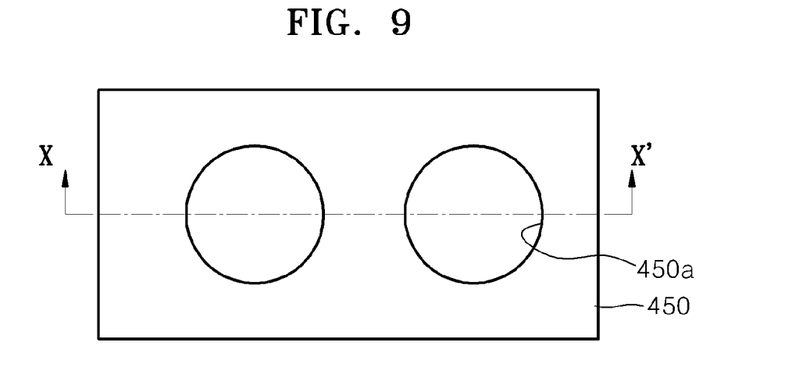
FIGS. 9 through 14 illustrate a method of manufacturing a composite structure of graphene and polymer according to an exemplary embodiment of the present invention.
Figure 10:
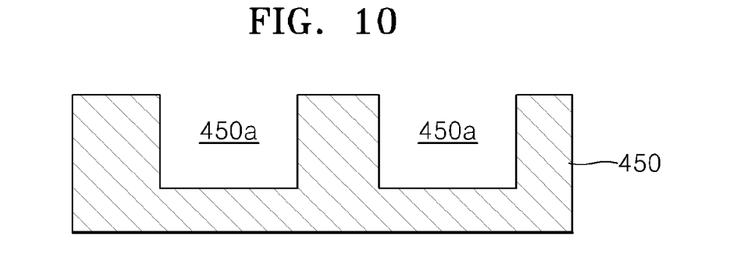

FIGS. 9 through 14 illustrate a method of manufacturing a composite of graphene and polymer according to an exemplary embodiment of the present invention. FIG. 10 is a cross-sectional view of the composite cut along a line X-X'.

Referring to FIGS. 9 and 10, a growth substrate 450 is provided. The growth substrate 450 may have an uneven surface. For example, a three-dimensional groove 450a may be formed in the growth substrate 450, to a certain depth. The groove 450a may have various forms. A surface of the growth substrate 450 may have various volumetric shapes. The growth substrate 450 may include a material for growing graphenes. For example, the growth substrate 450 may be formed of a semiconductor material or a metal. Examples of the semiconductor material include a IV Group semiconductor such as Ge, a III-V Group semiconductor, or a II-VI Group semiconductor. Examples of the metal include Cu and Ni. However, the semiconductor material and the metal are not limited thereto.

Figure 11:
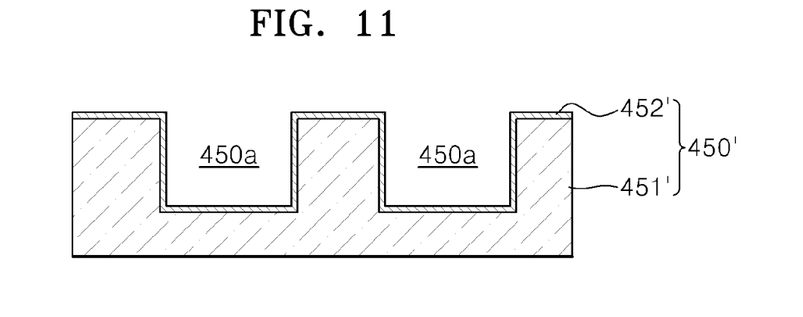

As illustrated in FIG. 11, a growth substrate 450' may include a substrate 451' and a growth film 452' formed on a surface of the substrate 451'. The groove 450a may be formed in the surface of the substrate 451', and the surface of the substrate 451' may be covered by the growth film 452'. The substrate 451' may be, for example, a silicon (Si) substrate, a glass substrate, a quartz substrate, or a flexible substrate or a substrate formed of other various materials. The growth film 452' may be formed of a material for forming graphene. For example, the growth film 452' may be formed of a semiconductor material or a metal. Examples of the semiconductor material include a IV Group semiconductor such as Ge, a III-V Group semiconductor, and a II-VI Group semiconductor. Examples of the metal include Cu and Ni. However, the semiconductor material and the metal are not limited thereto.

Figure 12:
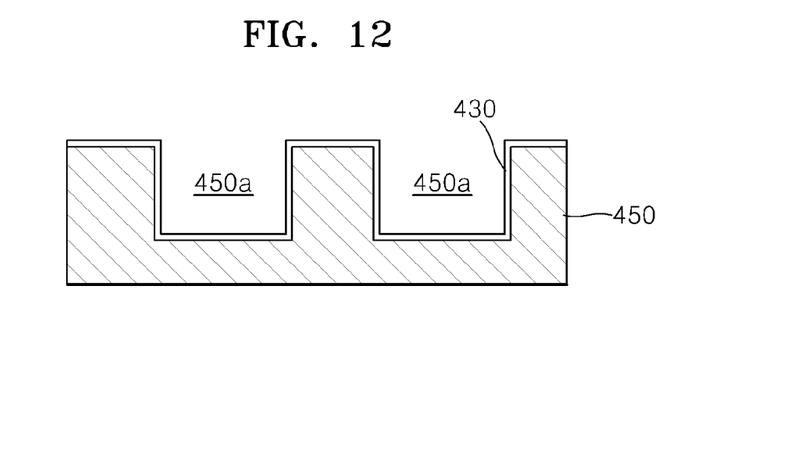

Referring to FIG. 12, a graphene layer 430 is formed on an uneven surface of the growth substrate 450, that is, on a surface of the growth substrate 450 that includes an inner surface of the groove 450a. The graphene layer 430 may be formed by growing graphene on a surface of the growth substrate 450, by using, for example, a chemical vapor deposition (CVD) method. The graphene layer 430 may be formed of graphene having a single-layer structure or a multi-layer structure.

Figure 13:
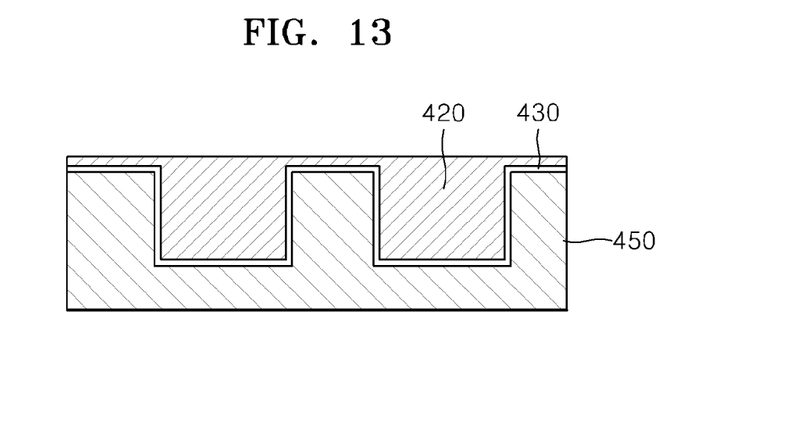

Referring to FIG. 13, a polymer structure 420 is formed on the graphene layer 430. The polymer structure 420 may be formed by filling a polymer in the groove 450a of the growth substrate 450, on the surface of which the graphene layer 430 is formed. Thus, the polymer structure 420 may be formed to have a three-dimensionally shaped surface corresponding to the groove 450a. The polymer structure 420 may be formed by, for example, coating, dipping, spraying, or dispensing a polymer on the growth substrate 450, but is not limited thereto.

Figure 14:
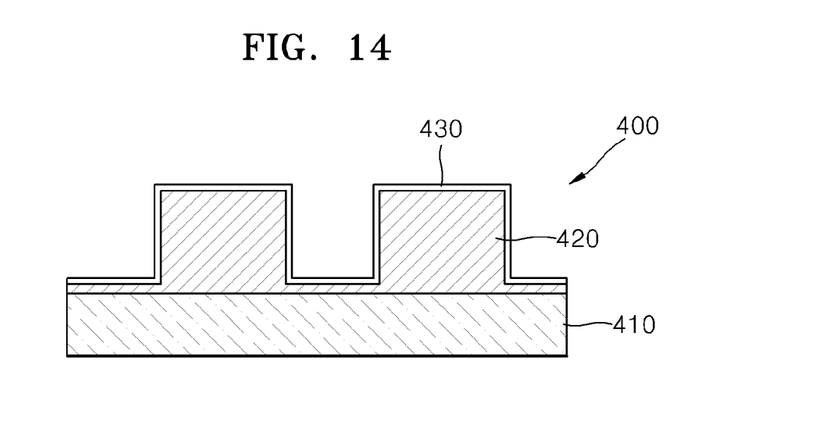

Referring to FIG. 14, when the growth substrate 450 is removed from the structure illustrated in FIG. 13, a composite structure 400 containing a graphene layer and a polymer structure, wherein the polymer structure 420 has a three-dimensional shape and the graphene layer 430 is provided on the polymer structure 420, is completed. The polymer structure 420 may include an uneven surface, and the graphene layer 430 may be formed on the uneven surface. Referring to FIG. 9, an upper surface of the polymer structure 420 illustrated in FIG. 8 is attached on a substrate 410. By modifying the shape of the groove 450a of the growth substrate 450 for growing, the composite 400 of graphene and polymer having various three-dimensional shapes may be manufactured. The graphene layer may cover the entirety of the uneven surface of the polymer structure or partially cover the uneven surface of the polymer structure.

As described above, according to the one or more of the above embodiments of the present invention, composites of graphene and polymer may be formed in various three-dimensional shapes. The composite of graphene and polymer has both a high electric conductivity of graphenes and a low thermal conductivity of polymer, and thus may be applied to the field of energy generation such as with respect to a thermoelectric element, or other various fields such as a capacitor, a sensor, or an optical element.

It should be understood that the exemplary embodiments described herein should be considered in a descriptive sense only and not for purposes of limitation. Descriptions of features or aspects within each embodiment should typically be considered as available for other similar features or aspects in other embodiments.

What is claimed is:

1. A structure, comprising:
   a substrate; and
   at least two composite structures of graphene and polymer each of which comprises
   at least one polymer structure having a three-dimensional shape; and
   a graphene layer provided on a top surface and a side surface of the polymer structure,
   wherein one entire surface of the polymer structure of one of the composite structures of graphene and polymer is disposed directly on and in contact with the substrate, and
   wherein the graphene layer of one of the composite structures of graphene and polymer is at least partially in direct contact with the graphene layer of its neighboring composite structure of graphene and polymer.

2. A structure, comprising:
   a substrate; and
   at least two composite structures of graphene and polymer each of which comprises
   at least one polymer structure of a three-dimensional shape; and
   a graphene layer covering a top surface and a side surface of the polymer structure,
   wherein one entire surface of the polymer structure of one of the composite structures of graphene and polymer is disposed directly on and in contact with the substrate,
   wherein the graphene layer of one of the composite structures of graphene and polymer is at least partially in direct contact with the graphene layer of its neighboring composite structure of graphene and polymer, and
   wherein a closest composite structure of graphene and polymer to the substrate has a first height determined from a surface of the substrate and has a second height determined from the surface of the substrate, said first height being the same as or greater than the thickness of the graphene layer, and said second height being greater than the first height.

3. The structure of claim 2, wherein the closest composite structure of graphene and polymer to the substrate has a plurality of sub-structures each having the first height and the second height.

4. The structure of claim 2, wherein the at least one polymer structure has an uneven surface, and the graphene layer is provided on the uneven surface, and wherein the at least one polymer structure has a first thickness and a second thickness, said first thickness being zero or greater and said second thickness being greater than the first thickness.

5. The structure of claim 2, wherein the graphene layer has a single-layer structure or a multi-layer structure.

6. The structure claim 2, wherein the at least two composite structures of graphene and polymer are stacked vertically on one another.

7. The structure of claim 2, wherein at least one of the polymer structure and the graphene layer is doped with impurities.

8. The structure of claim 6, wherein the orientation of the longitudinal axis of the elongated protrusion of one composite structure is not same as the orientation of the longitudinal axis of other elongated protrusion of other composite structures.

9. A method of manufacturing a structure, the method comprising:
   providing a growth substrate having an uneven surface;
   forming a graphene layer on a surface of the growth substrate;
   forming a polymer structure on the graphene layer; and
   removing the growth substrate wherein the structure comprises:
   a substrate; and
   at least two composite structures of graphene and polymer each of which comprises
   at least one polymer structure having a three-dimensional shape; and
   a graphene layer provided on a top surface and a side surface of the polymer structure,
   wherein one entire surface of the polymer structure of one of the composite structures of graphene and polymer is disposed directly on and in contact with the substrate, and
   wherein the graphene layer of one of the composite structures of graphene and polymer is at least partially in direct contact with the graphene layer of its neighboring composite structure of graphene and polymer.

10. The method of claim 9, wherein the growth substrate includes a semiconductor material or a metal.

11. The method of claim 10, wherein the semiconductor material comprises a IV Group, III-V Group, or I-VI Group semiconductor material.

12. The method of claim 9, wherein the growth substrate comprises a substrate having the uneven surface and a growth film formed on the surface of the substrate.

13. The method of claim 12, wherein the growth substrate is a silicon (Si) substrate, a glass substrate, a quartz substrate, or a flexible substrate.

14. The method of claim 12, wherein the growth film comprises a semiconductor material or a metal.

15. The method of claim 9, wherein the graphene layer has a single-layer structure or a multi-layer structure.

16. The method of claim 9, wherein the polymer structure is formed by coating, dipping, spraying, or dispensing a polymer on the growth substrate.

* * * * *